United States Patent
Wang et al.

(10) Patent No.: US 10,910,288 B2
(45) Date of Patent: Feb. 2, 2021

(54) INTEGRATED CIRCUIT PACKAGE STRUCTURE AND PACKAGE METHOD

(71) Applicant: BOE TECHNOLOGY GROUP CO., LTD., Beijing (CN)

(72) Inventors: Zhidong Wang, Beijing (CN); Ronghua Lan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/441,776

(22) Filed: Jun. 14, 2019

(65) Prior Publication Data

US 2020/0083131 A1 Mar. 12, 2020

(30) Foreign Application Priority Data

Sep. 12, 2018 (CN) .......................... 2018 1 1064600

(51) Int. Cl.
| | | |
|---|---|---|
| H01L 23/31 | (2006.01) | |
| H01L 21/48 | (2006.01) | |
| H01L 21/56 | (2006.01) | |
| H01L 23/29 | (2006.01) | |

(52) U.S. Cl.
CPC ...... *H01L 23/3135* (2013.01); *H01L 21/4853* (2013.01); *H01L 21/4857* (2013.01); *H01L 21/561* (2013.01); *H01L 21/568* (2013.01); *H01L 23/293* (2013.01); *H01L 23/3128* (2013.01)

(58) Field of Classification Search
CPC .......................... H01L 23/3135; H01L 21/56
See application file for complete search history.

(56) References Cited

U.S. PATENT DOCUMENTS

| | | | | |
|---|---|---|---|---|
| 5,439,849 A | * | 8/1995 | McBride | ............... H01L 23/291 257/E23.118 |
| 7,960,860 B2 | * | 6/2011 | Apfel | ........................ H02J 1/00 307/31 |
| 8,203,222 B2 | * | 6/2012 | Watanabe | ........... H01L 23/3135 257/790 |

(Continued)

FOREIGN PATENT DOCUMENTS

| | | |
|---|---|---|
| CN | 1498059 A | 5/2004 |
| CN | 101907798 A | 12/2010 |
| CN | 107301983 A | 10/2017 |

OTHER PUBLICATIONS

Chinese Office Action in Chinese Application No. 201811064600.9, dated Dec. 4, 2019 with English translation.

*Primary Examiner* — David A Zarneke
(74) *Attorney, Agent, or Firm* — Collard & Roe, P.C.

(57) ABSTRACT

An integrated circuit package structure and a package method. The integrated circuit package structure includes: a semiconductor chip, an encapsulation layer covering the semiconductor chip, the encapsulation layer including a first encapsulation layer and a second encapsulation layer alternately stacked, a sum of a number of the first encapsulation layer and a number of the second encapsulation layer being at least 3; wherein a thermal expansion coefficient of one of the first encapsulation layer and the second encapsulation layer is positive, and a thermal expansion coefficient of the other of the first encapsulation layer and the second encapsulation layer is negative.

19 Claims, 5 Drawing Sheets

(56) References Cited

U.S. PATENT DOCUMENTS

| | | | | |
|---|---|---|---|---|
| 8,878,350 B1* | 11/2014 | Sridharan | ........... | H01L 23/3135 |
| | | | | 257/684 |
| 8,929,089 B2* | 1/2015 | Asami | ................... | H01L 23/552 |
| | | | | 361/760 |
| 9,203,042 B2* | 12/2015 | Schmid | ............... | H01L 51/5256 |
| 9,583,409 B2* | 2/2017 | Yokoyama | .............. | H01L 23/28 |
| 10,476,028 B2* | 11/2019 | Huang | ................ | H01L 51/5256 |
| 2004/0178487 A1* | 9/2004 | Tanemura | ........... | H01L 23/3135 |
| | | | | 257/678 |
| 2005/0064628 A1* | 3/2005 | Doescher | ................ | H01L 21/56 |
| | | | | 438/110 |
| 2009/0108440 A1* | 4/2009 | Meyer | ..................... | H01L 24/96 |
| | | | | 257/723 |
| 2010/0184256 A1* | 7/2010 | Chino | ................... | H01L 23/488 |
| | | | | 438/118 |
| 2010/0309397 A1 | 12/2010 | Iijima et al. | | |
| 2015/0318228 A1* | 11/2015 | Ito | ...................... | H01L 23/3114 |
| | | | | 257/789 |
| 2018/0208805 A1* | 7/2018 | Mieda | .................. | C08F 2/48 |
| 2019/0067147 A1* | 2/2019 | Tsutsumi | .............. | B29C 70/681 |
| 2019/0080975 A1* | 3/2019 | Lee | ......................... | H01L 24/13 |
| 2019/0181101 A1* | 6/2019 | Obata | .................. | H01L 23/562 |
| 2019/0363664 A1* | 11/2019 | Nakamura | ........... | B62D 5/0493 |
| 2020/0219825 A1* | 7/2020 | Lee | ..................... | H01L 23/3128 |

\* cited by examiner

INTEGRATED CIRCUIT PACKAGE STRUCTURE AND PACKAGE METHOD

The present application claims priority of the Chinese Patent Application No. 201811064600.9, filed on Sep. 12, 2018, the disclosure of which is incorporated herein by reference in its entirety as part of the present application.

TECHNICAL FIELD

Embodiments of the present disclosure relate to an integrated circuit package structure and a package method.

BACKGROUND

With the continuous development of electronic information technology, integrated circuits are developing toward high performance. The integrated circuit package structure has also become one of the standards for measuring the quality of integrated circuits. At present, an integrated circuit package structure usually covers a semiconductor chip with one layer of an encapsulation layer, so as to protect the semiconductor chip.

Whether in the formation of the encapsulation layer or in the subsequent processing of the integrated circuit package structure, the encapsulation layer is heated at a high temperature. However, the encapsulation layer may be deformed by heat, which easily causes warpage of the integrated circuit package structure, so that a position of a solder pad of the semiconductor chip shifts and the solder pad cannot be accurately docked with a position of a redistribution layer to be connected to the solder pad, which is disadvantageous for the package of integrated circuits.

SUMMARY

At least one embodiment of the present disclosure provides an integrated circuit package structure, which includes: a semiconductor chip, an encapsulation layer covering the semiconductor chip, the encapsulation layer including a first encapsulation layer and a second encapsulation layer alternately stacked, a sum of a number of the first encapsulation layer and a number of the second encapsulation layer being at least 3; wherein a thermal expansion coefficient of one of the first encapsulation layer and the second encapsulation layer is positive, and a thermal expansion coefficient of the other of the first encapsulation layer and the second encapsulation layer is negative.

In some examples, an absolute value of the thermal expansion coefficient of the first encapsulation layer is equal to an absolute value of the thermal expansion coefficient of the second encapsulation layer.

In some examples, the absolute value of the thermal expansion coefficient of the first encapsulation layer is 8-13 ppm/° C., and the absolute value of the thermal expansion coefficient of the second encapsulation layer is 8-13 ppm/° C.

In some examples, one of the first encapsulation layer and the second encapsulation layer has a composite material of an epoxy resin and a first inorganic compound, the other of the first encapsulation layer and the second encapsulating layer has a composite material of an epoxy resin and a second inorganic compound, the first inorganic compound and the second inorganic compound have a negative thermal expansion coefficient, and an absolute value of the thermal expansion coefficient of the first inorganic compound is less than an absolute value of the thermal expansion coefficient of the second inorganic compound.

In some examples, the integrated circuit package structure further includes: a redistribution layer and a solder ball, wherein the redistribution layer includes a first side and a second side opposite to the first side, the semiconductor chip and the encapsulation layer are located at the first side, the solder ball is located at the second side.

In some examples, a side of the semiconductor chip facing the redistribution layer includes a solder pad, the encapsulation layer coats a surface of the semiconductor chip other than a surface of the solder pad.

In some examples, a thickness of the first encapsulation layer is equal to a thickness of the second encapsulation layer.

In some examples, an absolute value of the thermal expansion coefficient of the first encapsulation layer is greater than an absolute value of the thermal expansion coefficient of the second encapsulation layer, and a thickness of the first encapsulation layer is less than a thickness of the second encapsulation layer; or, an absolute value of the thermal expansion coefficient of the first encapsulation layer is less than an absolute value of the thermal expansion coefficient of the second encapsulation layer, and a thickness of the first encapsulation layer is greater than a thickness of the second encapsulation layer.

At least one embodiment of the present disclosure provides a package method of an integrated circuit, which includes: attaching a semiconductor chip on a package carrier; forming a first encapsulation layer and a second encapsulation layer alternately stacked on the package carrier to obtain an encapsulation layer, the encapsulation layer covering the semiconductor chip, one of the first encapsulation layer and the second encapsulation layer having a positive thermal expansion coefficient, and the other of the first encapsulation layer and the second encapsulation layer having a negative thermal expansion coefficient.

In some examples, a thermal expansion coefficient of the package carrier is 0-11 ppm/° C.

In some examples, the forming the first encapsulation layer and the second encapsulation layer alternately stacked on the package carrier, includes: forming at least one first encapsulation material layer and at least one second encapsulation material layer alternately stacked on the package carrier sequentially; heating and curing the first encapsulation material layer and the second encapsulation material layer, to obtain the first encapsulation layer and the second encapsulation layer alternately stacked.

In some examples, the package method further includes: after forming the first encapsulation layer and the second encapsulation layer alternately stacked on the package carrier, removing the package carrier; forming a redistribution layer on an exposed side of the semiconductor chip, and forming a solder ball on a side of the redistribution layer facing away from the semiconductor chip.

In some examples, the package method further includes: after forming the solder ball on the side of the redistribution layer facing away from the semiconductor chip, cutting the encapsulation layer to obtain a plurality of integrated circuit package structures.

BRIEF DESCRIPTION OF THE DRAWINGS

In order to clearly illustrate the technical solutions of the embodiments of the disclosure, the drawings of the embodiments will be briefly described in the following; it is obvious

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Integrated circuit packages are mainly divided into two types, System in Package and Wafer Level Package (WLP).

System in Package is a type of package that integrates multiple functional chips, including processor, memory, and other functional chips into a single package structure to achieve a substantially complete function. Wafer Level Package is a type of package that packages most or all of the chips on a wafer, and then the chips on the wafer are cut to obtain a single packaged chip.

Wafer Level Package includes Fan-out Wafer Level Package (FoWLP) and Fan-in Wafer Level Package (FiWLP). Fan-in Wafer Level Package is to package the chip before the wafer is cut, and then cut and divide the wafer. The completed package size is the same as the chip size. And Fan-out Wafer Level Package is to re-arranged the chip on a manual wafer based on wafer reconstruction technology, then package the chip in a similar manner as Fan-in Wafer Level Package. The size of the obtained package structure is greater than the chip size.

A package structure provided by embodiments of the present disclosure can be any one of the aforementioned package structures of System in Package and Wafer Level Package.

Figure 1:
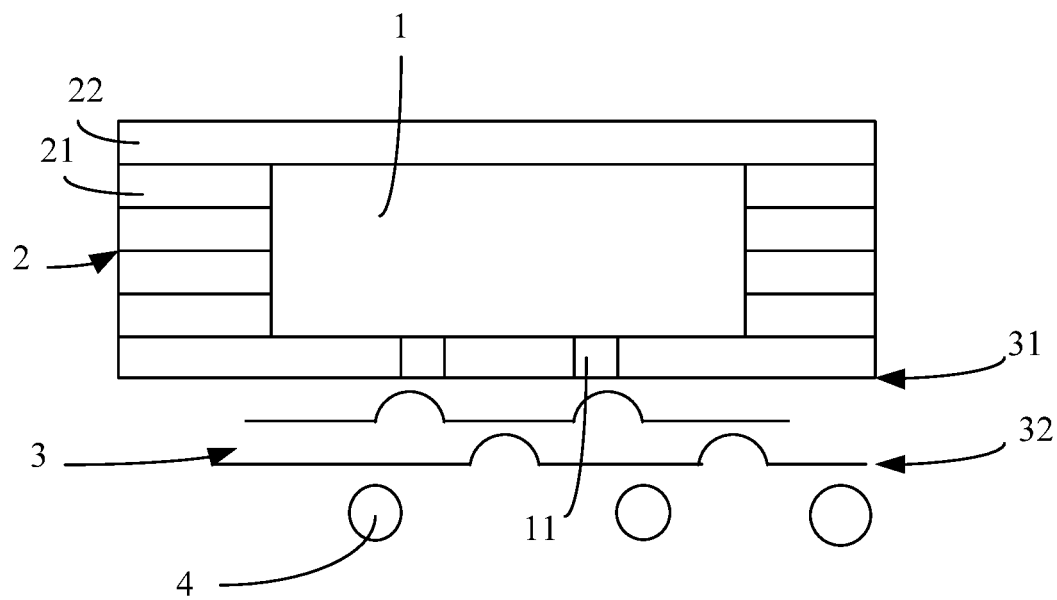
FIG. 1 is a schematic structural diagram of an integrated circuit package structure provided by an embodiment of the present disclosure.

FIG. 1 is a schematic structural diagram of an integrated circuit package structure provided by an embodiment of the present disclosure. As shown in FIG. 1, the integrated circuit package structure includes: a semiconductor chip 1 and an encapsulation layer 2. The encapsulation layer 2 covers the semiconductor chip 1, the encapsulation layer 2 includes a first encapsulation layer 21 and a second encapsulation layer 22 alternately stacked, and a sum of a number of the first encapsulation layer 21 and a number of the second encapsulation layer 22 is at least 3. A thermal expansion coefficient of one of the first encapsulation layer 21 and the second encapsulation layer 22 is positive, and a thermal expansion coefficient of the other of the first encapsulation layer 21 and the second encapsulation layer 22 is negative.

A positive thermal expansion coefficient means that an object will expand after being heated, while a negative thermal expansion coefficient means that an object will shrink after being heated.

The encapsulation layer 2 is a plastic shell formed on the semiconductor chip 1 for protecting the semiconductor chip 1 and preventing the semiconductor chip 1 from being interfered by external environment.

In the embodiments of the present disclosure, the encapsulation layer 2 includes the first encapsulation layer 21 and the second encapsulation layer 22, and the thermal expansion coefficient of the first encapsulation layer 21 is contrary to the thermal expansion coefficient of the second encapsulation layer 22. In some embodiments of the present disclosure, the first encapsulation layer 21 can be a material that expands after being heated, while the second encapsulation layer 22 can be a material that shrinks after being heated. In some other embodiments of the present disclosure, the first encapsulation layer 21 can be a material that shrinks after being heated, while the second encapsulation layer 22 can be a material that expands after being heated.

In the embodiments of the present disclosure, the semiconductor chip 1 is a product form of a semiconductor component after being manufactured and before being packaged, which is packaged by the encapsulation layer to become an integrated circuit. A solder pad 11 is fixedly disposed on an active surface of the semiconductor chip 1. The active surface refers to a surface of the semiconductor chip 1 having an active region, and the active region refers to a region of the semiconductor chip 1 having an active element. The active element is usually a circuit component, such as a transistor, a memory unit, etc.

For example, the encapsulation layer coats a surface of the semiconductor chip other than a surface of the solder pad.

The integrated circuit package structure provided by the embodiments of the present disclosure includes a semiconductor chip and an encapsulation layer covering the semiconductor chip, wherein the encapsulation layer includes a first encapsulation layer and a second encapsulation layer alternately stacked. Moreover, a thermal expansion coefficient of each first encapsulation layer is contrary to a thermal expansion coefficient of each second encapsulation layer. Because both surfaces of the first encapsulation layer and both surfaces of the second encapsulation layer will have a deformation of expansion or shrinkage, that is, when the encapsulation layer is thermally deformed, the deformations of facing surfaces of the first encapsulation layer and the second encapsulation layer will counteract each other, while one of opposite surfaces of the first encapsulation layer and the second encapsulation layer will expand and the other will shrink, which may cause warpage of the encapsulation layer formed by the first encapsulation layer and the second encapsulation layer. Therefore, the embodiments of the present disclosure further defines that a sum of a number of the first encapsulation layer and a number of the second encapsulation layer is at least 3, so that at least one first encapsulation layer is further provided on the second encapsulation layer to reduce the deformation of the second encapsulation layer, thereby avoiding the problem of an inaccurate docking of the solder pad of the semiconductor chip caused by the warpage of the integrated circuit package structure, improving a yield of integrated circuit package, and facilitating a packaging of integrated circuits at the same time.

Optionally, a thermal expansion deformation of one of the first encapsulation layer 21 and the second encapsulation layer 22 under a unit temperature change is equal to a thermal shrinkage deformation of the other of the first encapsulation layer 21 and the second encapsulation layer 22 under a unit temperature change. The following description is illustrated by taking that the thermal expansion coefficient of the first encapsulation layer 21 is positive and the thermal expansion coefficient of the second encapsulation layer 22 is negative. That is, under a unit temperature change (for example, 1° C.), the expansion deformation of the first encapsulation layer 21 is equal to the shrinkage deformation of the second encapsulation layer 22, so that after the encapsulation layer 2 is heated, the deformations of the first encapsulation layer 21 and the second encapsulation layer 22 can completely counteract, thereby further improving reliability of the integrated circuit package structure.

In the above implementation, the thermal expansion deformation variable and the thermal shrinkage deformation variable are 8-13 ppm/° C. The following description is illustrated by taking that the thermal expansion coefficient of the first encapsulation layer 21 is positive and the thermal expansion coefficient of the second encapsulation layer 22 is negative. That is, the thermal expansion deformation variable of the first encapsulation layer 21 is 8-13 ppm/° C., and the thermal shrinkage deformation variable of the second encapsulation layer 22 is 8-13 ppm/° C. In the embodiments of the present disclosure, the encapsulation layer 2 adopts a material having a thermal expansion deformation variable or a thermal shrinkage deformation variable in the range of 8-13 ppm/° C., which can avoid excessive deformation of the first encapsulation layer 21 or the second encapsulation layer 22 when being heated, and is advantageous for forming a stable and reliable encapsulation layer on the semiconductor chip 1.

In the embodiments of the present disclosure, one of the first encapsulation layer 21 and the second encapsulation layer 22 has a composite material of an epoxy resin and a first inorganic compound, the other of the first encapsulation layer 21 and the second encapsulating layer 22 has a composite material of an epoxy resin and a second inorganic compound, the first inorganic compound and the second inorganic compound have a negative thermal expansion coefficient, and an absolute value of the thermal expansion coefficient of the first inorganic compound is less than an absolute value of the thermal expansion coefficient of the second inorganic compound. Because the epoxy resin has a thermal expansion property, a thermal expansion coefficient thereof is positive. At present, a method of reducing the thermal expansion coefficient of an epoxy resin is generally to reduce the thermal expansion coefficient of the epoxy resin by filling various materials having a negative thermal expansion coefficient. Therefore, in the embodiments of the present disclosure, an inorganic compound having a negative thermal expansion coefficient is filled in the epoxy resin to reduce the thermal expansion coefficient of the epoxy resin, so as to reduce the thermal deformation variable existing when forming the encapsulation layer, and to facilitate packaging. The first inorganic compound can be $ZrW_2O_8$ having a thermal expansion coefficient of −3 to −10 ppm/° C. The second inorganic compound can be $Mn_{0.983}CoGe$ having a thermal expansion coefficient of −100 to −200 ppm/° C.

As described above, if the thermal expansion coefficient of the first encapsulation layer 21 is expected to be 8-13 ppm/° C., the first encapsulation layer 21 can be a composite material of epoxy resin and $ZrW_2O_8$, and when a mass ratio of epoxy resin and $ZrW_2O_8$ is 10:9, the thermal expansion coefficient of the composite material is 10.5 ppm/° C. If the thermal expansion coefficient of the second encapsulation layer 22 is expected to be 8-13 ppm/° C., the second encapsulation layer 22 can be a composite material of epoxy resin and $Mn_{0.983}CoGe$, and when $Mn_{0.983}CoGe$ accounts for 26% of total volume, the thermal expansion coefficient of the composite material is −9 ppm/° C.

It should be noted that the first encapsulation layer 21 and the second encapsulation layer 22 adopting a material having a thermal deformation variable of 8-13 ppm/° C., is to reduce the deformation of the first encapsulation layer 21 and the second encapsulation layer 22, so as to facilitate packaging. In some embodiments of the present disclosure, when requirements for the thermal deformation variables of the first encapsulation layer 21 and the second encapsulation layer 22 are not high, one of the first encapsulation layer 21 and the second encapsulation layer 22 can be an epoxy resin or a polypropylene resin, etc., and the other of the first encapsulation layer 21 and the second encapsulation layer 22 can be a composite material of an epoxy resin or a polypropylene resin and other inorganic compound, which are not limited thereto by the present disclosure.

As shown in FIG. 1, the integrated circuit package structure further includes a redistribution layer 3 and a solder ball 4, wherein the redistribution layer 3 includes a first side 31 and a second side 32 opposite to the first side 31, the semiconductor chip 1 and the encapsulation layer 2 are located at the first side 31, the solder ball 4 is located at the second side 32. The redistribution layer 3 is a layer body for re-arranging the position of the solder pad 11 on the semiconductor chip 1, which leads the connection position of the solder pad 11 to other positions of the redistribution layer 3 through a wire or a conductive structure in the redistribution layer 3. The redistribution layer 3 allows the spacing between the re-arranged solder pads 11 to meet the minimum spacing requirement for implanting the solder ball 4. After the solder pad 11 of the semiconductor chip 1 is re-arranged by the redistribution layer 3, and the solder ball 4 is implanted at the re-arranged position, a power-on operation of the semiconductor chip 1 can be realized by wiring.

For example, when the semiconductor chip 11 is combined with the redistribution layer 3, the side surface of the semiconductor chip 1 having the solder pad 11 faces the redistribution layer 3.

In the embodiments of the present disclosure, the redistribution layer 3 can include a conductive structure and a protective layer coated at an outer side of the conductive structure. One side of the conductive structure is connected to the solder pad 11 and the other side of the conductive structure is connected to the solder ball 4. The protective layer can adopt a material such as titanium nitride, tantalum nitride or tungsten nitride. The conductive structure can adopt conductive materials such as electroplated copper, etc.

Exemplarily, in the present embodiment, a thickness of the first encapsulation layer 21 is equal to a thickness of the second encapsulation layer 22. The thickness of the first encapsulation layer 21 and the thickness of the second encapsulation layer 22 can be 0.1-30 μm. Because the thickness of the encapsulation layer is generally determined according to a thickness of the semiconductor chip, and is equal to the thickness of the semiconductor chip plus a surplus thickness. The surplus thickness is an amount by which the thickness of the encapsulation layer is more than the thickness of the semiconductor chip, which is usually 5-60 μm.

In the embodiment of the present disclosure, when the absolute values of the thermal expansion coefficients of the materials adopted by the first encapsulation layer and the second encapsulation layer are equal, the thicknesses of the first encapsulation layer and the second encapsulation layer can be equal to achieve the purpose of exactly counteracting the deformation of the first encapsulation layer and the deformation of the second encapsulation layer. When the absolute value of the thermal expansion coefficient of the first encapsulation layer is greater than the absolute value of the thermal expansion coefficient of the second encapsulation layer, that is, the deformation amount of the first encapsulation layer is greater than the deformation amount of the second encapsulation layer at this moment, therefore, in order to achieve the purpose of exactly counteracting the deformation of the first encapsulation layer and the deformation of the second encapsulation layer, the thickness of the first encapsulation layer can be less than the thickness of the second encapsulation layer. When the absolute value of the thermal expansion coefficient of the first encapsulation layer is less than the absolute value of the thermal expansion coefficient of the second encapsulation layer, that is, the deformation amount of the first encapsulation layer is less than the deformation amount of the second encapsulation layer at this moment, therefore, in order to achieve the purpose of exactly counteracting the deformation of the first encapsulation layer and the deformation of the second encapsulation layer, the thickness of the first encapsulation layer can be greater than the thickness of the second encapsulation layer.

In the present embodiment, the number of the first encapsulation layer 21 can be equal to the number of the second encapsulation layer 22, so that both of them can better counteract the deformation amounts. In other embodiments, the number of the first encapsulation layer 21 and the number of the second encapsulation layer 22 can also be unequal. Because the first encapsulation layer 21 and the second encapsulation layer 22 are alternately stacked, the number of the first encapsulation layer 21 and the number of the second encapsulation layer 22 varies by 1 at most, which can still achieve he purpose of counteracting the deformation amounts of the first encapsulation layer 21 and the second encapsulation layer 22.

Figure 2:
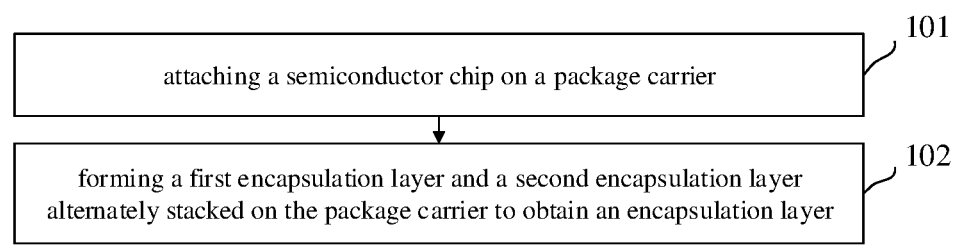
FIG. 2 is a flowchart of a package method of an integrated circuit provided by an embodiment of the present disclosure.

FIG. 2 is a flowchart of a package method of an integrated circuit provided by an embodiment of the present disclosure. The package method can be used to form the integrated circuit package structure shown in FIG. 1.

As shown in FIG. 2, the package method includes:

Step 101: attaching a semiconductor chip on a package carrier.

The package carrier is also referred to as a substrate for providing a planar support for the semiconductor chip when packaging the semiconductor chip.

Step 102: forming a first encapsulation layer and a second encapsulation layer alternately stacked on the package carrier to obtain an encapsulation layer.

One of the first encapsulation layer and the second encapsulation layer has a positive thermal expansion coefficient, and the other of the first encapsulation layer and the second encapsulation layer has a negative thermal expansion coefficient.

In step S102, the encapsulation layer formed on the package carrier covers the semiconductor chip to realize a protection for the semiconductor chip.

It should be noted that, in the embodiment of the present disclosure, a sum of a number of the first encapsulation layer and a number of the second encapsulation layer is at least 3. Because a thermal expansion coefficient of the first encapsulation layer is contrary to a thermal expansion coefficient of the second encapsulation layer in the embodiment of the present disclosure, when only the first encapsulation layer and the second encapsulation layer are existed and heated, the deformations of facing surfaces of the first encapsulation layer and the second encapsulation layer will counteract each other, while one of opposite surfaces of the first encapsulation layer and the second encapsulation layer will expand and the other will shrink, which may cause warpage of the encapsulation layer formed by the first encapsulation layer and the second encapsulation layer. Therefore, in order to avoid a emergence of the warpage due to the above condition, it is necessary to ensure that at least one first encapsulation layer is further disposed on the second encapsulation layer, thereby ensuring a reduction of the deformation of the second encapsulation layer and avoiding the emergence of the warpage.

For the reasons described above, step 102 can include: firstly forming one first encapsulation material layer; then forming one second encapsulation material layer. In order to prevent the problem of warpage resulting from that there exist only one first encapsulation material layer and one second encapsulation material layer when being heated, it is necessary to continue to form another first encapsulation material layer and another second encapsulation material layer (or only to form another first encapsulation material layer), and then the formed two layers of the first encapsulation material layer and the formed two layers of the second encapsulation material layer are heated and cured to obtain the first encapsulation layer and the second encapsulation layer alternately stacked. If the first encapsulation layer and the second encapsulation layer being formed at this time do not reach a required number, when the first encapsulation material layer and the second encapsulation material layer are subsequently formed, only one layer of the first encapsulation material layer and one layer of the second encapsulation material layer are need to be formed, then heating and curing can be performed, until the required number of the first encapsulation layer and the second encapsulation layer are formed. Both the first encapsulation material layer and the second encapsulation material layer can be formed by coating.

Step 102 can also include: forming one first encapsulation material layer on the package carrier; then forming one second encapsulation material layer, and so on, until a required number of the first encapsulation material layer and the second encapsulation material layer are formed. And then, all the first encapsulation material layer and the second encapsulation material layer are heated and cured to obtain the encapsulation layer.

In the present embodiment, when a total thickness of the first encapsulation layer and the second encapsulation layer having been formed does not exceed the thickness of the semiconductor chip, both the first encapsulation layer and the second encapsulation layer are distributed around the semiconductor chip. When the first encapsulation layer and the second encapsulation layer having been formed exceeds the thickness of the semiconductor chip, the first encapsulation layer and the second encapsulation layer to be formed subsequently are covered on the semiconductor chip.

It should be noted that, a thickness refers to a dimension in a direction perpendicular to the plane of the package carrier for supporting the semiconductor chip.

The package method of the integrated circuit package structure provided by the embodiments of the present disclosure, provides a good package plane for the semiconductor chip by attaching the semiconductor chip on the package carrier. And after the semiconductor chip is fixed, the first encapsulation material layer and the second encapsulation material layer alternately stacked are formed on the package carrier in a form of covering the semiconductor chip, which are heated and cured to obtain the first encapsulation layer and the second encapsulation layer, until the semiconductor chip is covered and the encapsulation layer is obtained. Because the thermal expansion coefficient of each first encapsulation layer is contrary to the thermal expansion coefficient of each second encapsulation layer, that is, when the encapsulation layer is thermally deformed, one of the first encapsulation layer and the second encapsulation layer can be thermally expanded while the other of the first encapsulation layer and the second encapsulation layer can be thermally shrunk, so that the deformations of the first encapsulation layer and the second encapsulation layer will counteract each other, thereby preventing the encapsulation layer from being thermally deformed and facilitating a packaging of the integrated circuits.

Figure 3:
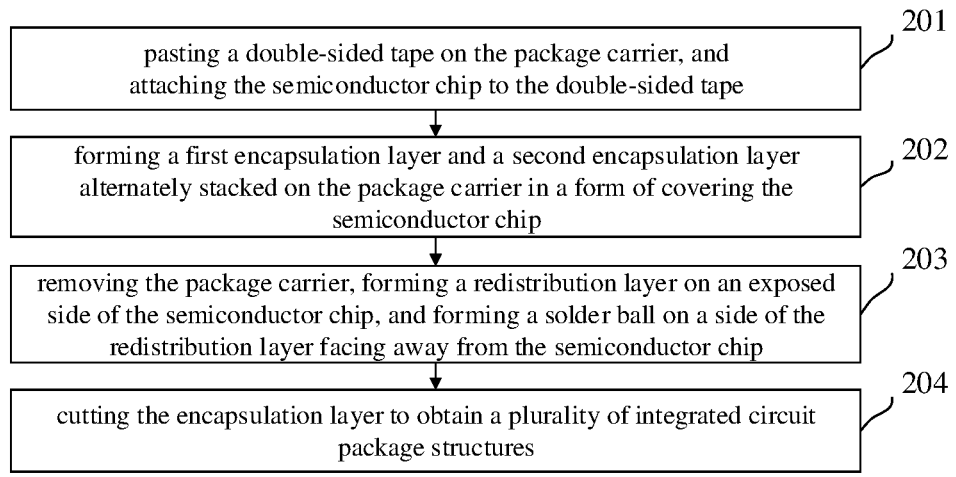
FIG. 3 is a flowchart of a package method of an integrated circuit provided by another embodiment of the present disclosure.

FIG. 3 is a flowchart of a package method of an integrated circuit provided by another embodiment of the present disclosure. A method of forming an encapsulation layer on a semiconductor chip provided by the package method is suitable for Wafer Level Package.

As shown in FIG. 3, the package method includes:

Step 201: attaching a semiconductor chip on a package carrier.

The package carrier, also referred to as a substrate, is used as an auxiliary tool for providing a supporting plane for the semiconductor chip 1 when packaging the semiconductor chip 1. In the embodiments of the present disclosure, a thermal expansion coefficient of the package carrier 5 is 0-11 ppm/° C. The package carrier 5 having a thermal expansion coefficient in the range of 0-11 ppm/° C., can prevent the package carrier 5 from being deformed by heat during the process of forming the encapsulation layer, thereby avoiding warpage of the integrated circuit package structure and facilitating a packaging of integrated circuits.

Exemplarily, the package carrier 5 can be a steel plate having a coefficient of thermal expansion of 10 ppm/° C.

Step 201 can include:

first step: pasting a double-sided tape on the package carrier;

second step: attaching the semiconductor chip to the double-sided tape.

Figure 4:
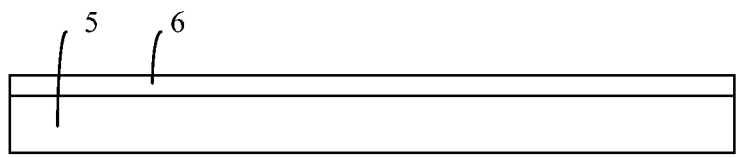
FIG. 4 is a first state diagram of an integrated circuit package structure provided by an embodiment of the present disclosure.

As shown in FIG. 4, the package carrier 5 is provided with a double-sided tape 6 on a surface of the package carrier 5. To paste the double-sided tape 6 on the surface of the package carrier 5, an imprinting process can be employed, that is, the double-sided tape 6 is imprinted on the surface of the package carrier 5 by using a laminating tool.

Specifically, the double-sided tape 6 pasted on the package carrier 5 can be debonded from the package carrier 5 and the semiconductor chip 1 by, for example, heat or ultraviolet treatment. Exemplarily, the double-sided tape 6 can be a silicone rubber.

Figure 5:
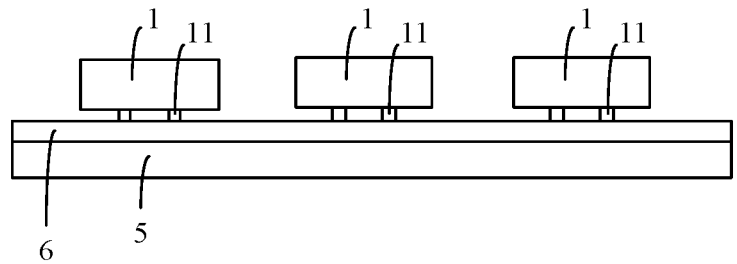
FIG. 5 is a second state diagram of an integrated circuit package structure provided by an embodiment of the present disclosure.

As shown in FIG. 5, after the double-sided tape 6 is pasted on the package carrier 5, the semiconductor chip 1 is attached to the double-sided tape 6. In the embodiments of the present disclosure, a plurality of semiconductor chips 1 are attached to the double-sided tape 6, and the plurality of semiconductor chips 1 are spaced on the package carrier 5, for example, can be arranged in an array on the package carrier 5.

When attaching the semiconductor chip 1, a mounting process can be employed, and the semiconductor chip 1 is placed on the double-sided tape 6. In the embodiments of the present disclosure, an active surface of the semiconductor chip 1 faces the package carrier 5 (referring to FIG. 5), which is belonging to a flip-chip technology of the semiconductor chip 1. In some embodiments of the present disclosure, the active surface of the semiconductor chip 1 is disposed facing away from the package carrier 5, which is belonging to a front-loading technology of the semiconductor chip 1, and is different from the flip-chip technology of semiconductor chip 1 in that the front-loading technology of the semiconductor chip 1 needs to bond the solder pad 11 on the semiconductor chip 1 to the redistribution layer 3 through a wire in a subsequent process to realize a circuit electrical connection of the semiconductor chip 1.

Step 202: forming a first encapsulation layer and a second encapsulation layer alternately stacked on the package carrier in a form of covering the semiconductor chip.

One of the first encapsulation layer 21 and the second encapsulation layer 22 has a positive thermal expansion coefficient, and the other of the first encapsulation layer 21 and the second encapsulation layer 22 has a negative thermal expansion coefficient.

For example, when the package carrier 5 adopts the steel plate exemplified in step 201, a small amount of expansion deformation will also occur due to heating of the steel plate. Therefore, in this case, the first encapsulation layer 21 can adopt a material having a negative thermal expansion coefficient, such as a polypropylene resin, to weaken the deformation of the steel plate.

In some embodiments of the present disclosure, when the package carrier 5 is a material having a thermal expansion coefficient of 0, when the first encapsulation layer 21 is disposed, there is no need to consider whether to adopt a material having a positive thermal expansion coefficient or to adopt a material having a negative thermal expansion coefficient.

In step 202, the encapsulation layer 2 formed on the package carrier 3 covers the semiconductor chip 1, so as to realize a protection for the semiconductor chip 1.

Step 202 can include:

first step: forming a first encapsulation material layer and a second encapsulation material layer alternately stacked on the package carrier sequentially;

second step: heating and curing the first encapsulation material layer and the second encapsulation material layer to obtain the first encapsulation layer and the second encapsulation layer alternately stacked.

Based on the first step and the second step of step 202, step 202 can include two implementations as follows.

First, step 202 can include: firstly forming one first encapsulation material layer; then forming one second encapsulation material layer. In order to prevent the problem of warpage resulting from that there are only one first encapsulation material layer and one second encapsulation material layer when being heated, it is necessary to continue to form another first encapsulation material layer and another second encapsulation material layer (or only to form another first encapsulation material layer), wherein the first encapsulation material layer and the second encapsulation material layer are the first encapsulation layer 21 and the second encapsulation layer 22 before being heated and cured. And then the formed first encapsulation material layer and the formed second encapsulation material layer are heated and cured to obtain the first encapsulation layer 21 and the second encapsulation layer 22 alternately stacked. If the first encapsulation layer 21 and the second encapsulation layer 22 being formed at this time do not reach a required number, when the first encapsulation material layer and the second encapsulation material layer are subsequently formed, only one layer of the first encapsulation material layer and one layer of the second encapsulation material layer are need to be formed, then heating and curing can be performed, until the required number of the first encapsulation layer 21 and the second encapsulation layer 22 are formed. Both the first encapsulation material layer and the second encapsulation material layer can be formed by coating.

Second, step 202 can also include: forming one first encapsulation material layer on the package carrier 3; then forming one second encapsulation material layer, and so on, until a required number of the first encapsulation material layer and the second encapsulation material layer are formed. And then, all the first encapsulation material layer and the second encapsulation material layer are heated and cured to form the first encapsulation layer 21 and the second encapsulation layer 22 alternately stacked, so as to obtain the encapsulation layer 2.

In the embodiments of the present disclosure, forming the first encapsulation layer 21 and the second encapsulation layer 22 alternately stacked refers to that the first encapsulation layer 21 and the second encapsulation layer 22 are alternately overlapped. For example, a second encapsulation layer 22 is stacked on a first encapsulation layer 21, and another first encapsulation layer 21 is stacked on the second encapsulation layer 22, and so on, until a required number of the first encapsulation layer 21 and the second encapsulation layer 22 are formed.

In the embodiments of the present disclosure, when a total thickness of the first encapsulation layer 21 and the second encapsulation layer 22 having been formed does not exceed the thickness of the semiconductor chip 1, both the first encapsulation layer 21 and the second encapsulation layer 22 are distributed around the semiconductor chip 1. When the first encapsulation layer 21 and the second encapsulation layer 22 having been formed exceeds the thickness of the semiconductor chip 1, the first encapsulation layer 21 and the second encapsulation layer 22 to be formed subsequently are covered on the semiconductor chip 1.

In the above implementation manners, when the total thickness of the first encapsulation material layer and the second encapsulation material layer having been formed does not exceed the thickness of the semiconductor chip 1, the first encapsulation material layer or the second encapsulation material layer can be formed by spin coating. An exemplary process may be: dropping a coating material in a liquid state on a side of the package carrier 5 to which the semiconductor chip 1 is attached, wherein the coating material is a material for forming the first encapsulation material layer or the second encapsulation material layer. Then, the package carrier 5 is rotated at a high speed by a spin coater, and the coating material fallen on the package carrier 5 is completely spread on the surface of the package carrier 5 by centrifugal force generated from the rotating of the package carrier 5 and gravity, so that, not only the coating material is not coated on the surface of the semiconductor chip 1 when the first encapsulation material layer or the second encapsulation material layer is formed, but also the coating material can be easily coated in the gap between the package carrier 5 and the solder pad 11, thereby improving efficiency of forming the encapsulation layer.

Figure 6:
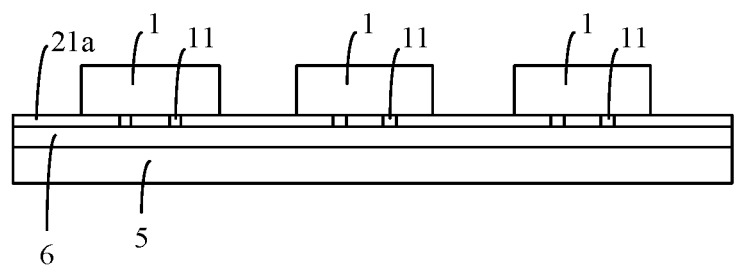
FIG. 6 is a third state diagram of an integrated circuit package structure provided by an embodiment of the present disclosure.

FIG. 6 to FIG. 9 show one implementation of an embodiment of the present disclosure. As shown in FIG. 6, one first encapsulation material layer 21a is formed on the package carrier 5. And the first encapsulation material layer 21a is distributed around the semiconductor chip 1, that is, the semiconductor chip 1 is located among the first encapsulation material layers 21a.

Exemplarily, the first encapsulation material layer 21a can be a polypropylene resin having a thermal shrinkage property and having a thermal shrinkage deformation variable between 8-13 ppm/° C.

Figure 7:
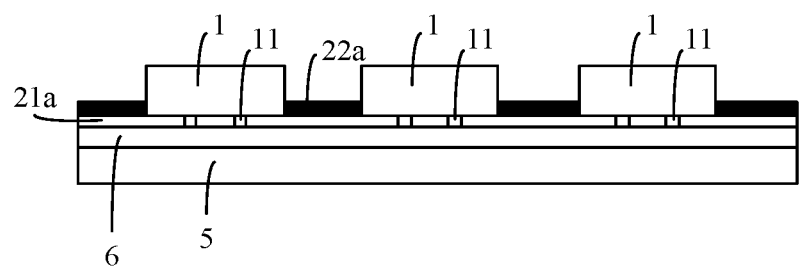
FIG. 7 is a fourth state diagram of an integrated circuit package structure provided by an embodiment of the present disclosure.

As shown in FIG. 7, a second encapsulation material layer 22a is formed on the first encapsulation material layer 21a. In the embodiment of the present disclosure, a thickness of the first encapsulation material layer 21a does not exceed the thickness of the semiconductor chip 1 (referring to FIG. 7), therefore, the formed second encapsulation material layer 22a is also distributed around the semiconductor chip 1.

Exemplarily, the second encapsulation material layer 21a can be an epoxy resin having a thermal expansion property and having a thermal expansion deformation variable between 8-13 ppm/° C.

Figure 8:
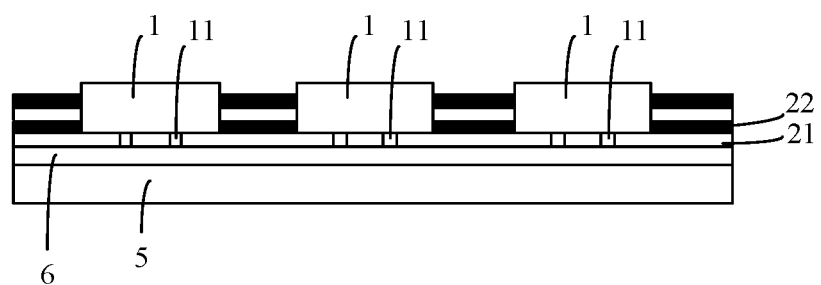
FIG. 8 is a fifth state diagram of an integrated circuit package structure provided by an embodiment of the present disclosure.

After the first encapsulation material layer 21a and the second encapsulation material layer 22a are formed on the package carrier, in order to prevent the problem of warpage resulting from that there exist only one first encapsulation material layer 21a and one second encapsulation material layer 22a when being heated and cured, another first material encapsulation layer 21a and another second material encapsulation layer 22a are further formed (referring to FIG. 8). Then, the formed first encapsulation material layers 21a and the formed second encapsulation material layer 22a are heated and cured to obtain the first encapsulation layer 21 and the second encapsulation layer 22 alternately stacked. If the first encapsulation layer 21 and the second encapsulation layer 22 being formed at this time do not reach a required number, when the first encapsulation material layer 21a and the second encapsulation material layer 22a are subsequently formed, only one layer of the first encapsulation material layer 21a and one layer of the second encapsulation material layer 22a are need to be formed, then heating and curing can be performed, until the required number of the first encapsulation layer 21 and the second encapsulation layer 22 are formed, so as to obtain the encapsulation layer 2.

One of the first encapsulation layer 21 and the second encapsulation layer 22 has a positive thermal expansion coefficient, and the other of the first encapsulation layer 21 and the second encapsulation layer 22 has a negative thermal expansion coefficient.

Figure 9:
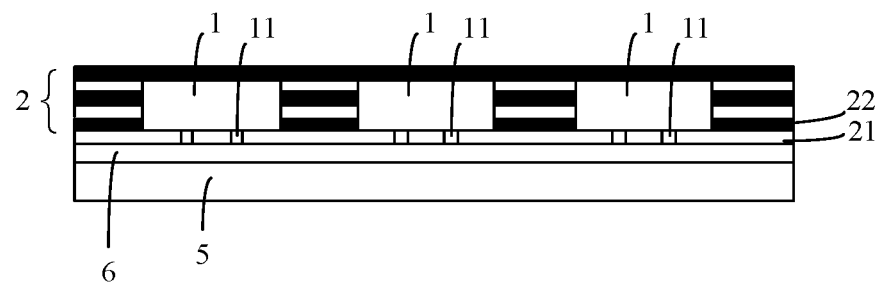
FIG. 9 is a sixth state diagram of an integrated circuit package structure provided by an embodiment of the present disclosure.

As shown in FIG. 9, the required number of the first encapsulation layer 21 and the second encapsulation layer 22 are formed on the package carrier 5, and the first encapsulation layer 21 and the second encapsulation layer 22 are alternately stacked. That is, an encapsulation layer is formed on the package carrier 5.

In the above implementation, apart from obtaining the encapsulation layer by the method of forming the required number of the first encapsulation layer 21 and the second encapsulation layer 22 on the package carrier 5, the encapsulation layer can also be obtained by forming the first encapsulation layer 21 and the second encapsulation layer 22 on the package carrier 5 until a total thickness of the first encapsulation layer 21 and the second encapsulation layer 22 reaching a set thickness.

Step 203: removing the package carrier, forming a redistribution layer on an exposed side of the semiconductor chip, and forming a solder ball on a side of the redistribution layer facing away from the semiconductor chip.

Figure 10:
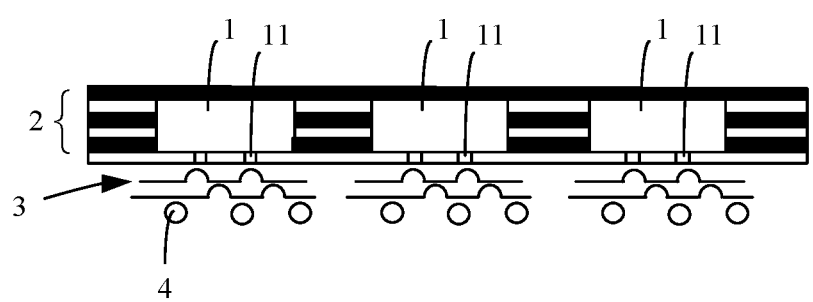
FIG. 10 is a seventh state diagram of an integrated circuit package structure provided by an embodiment of the present disclosure.

As shown in FIG. 10, after removing the package carrier 5, one side of the semiconductor chip 1 is exposed. The semiconductor chip 1 is flip-chip in the embodiment of the present disclosure, therefore, a solder pad 11 on the semiconductor chip 1 is exposed after the package carrier 5 is removed (referring to FIG. 10). In the embodiment of the present disclosure, in order to facilitate an electrical connection of the semiconductor chip 1, a redistribution layer 3 is formed on the exposed side of the semiconductor chip 1. The redistribution layer 3 can be one layer or a plurality of layers, which is not limited by the embodiment of the present disclosure.

Figure 11:
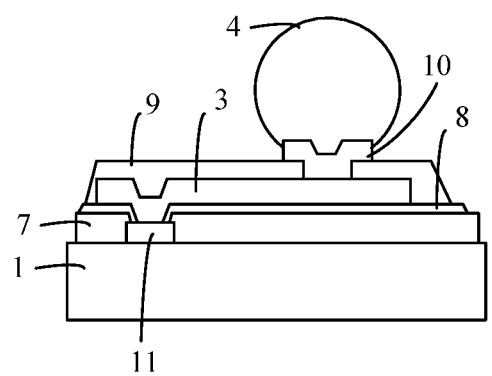
FIG. 11 is a schematic structural diagram of a redistribution layer provided by an embodiment of the present disclosure.

Exemplarily, taking forming one layer of the redistribution layer 3 as an example, the process of forming the redistribution layer 3 is briefly described. As shown in FIG. 11, a passivation layer 7 is formed on the exposed side of the semiconductor chip 1. The passivation layer 7 can be formed of a material such as titanium nitride, tantalum nitride, tungsten nitride, titanium oxynitride, tantalum oxynitride, tungsten oxynitride or titanium, etc. When the passivation layer 7 is formed, the passivation layer 7 can be formed on the exposed side of the semiconductor chip 1 using methods such as chemical vapor deposition, plasma enhanced chemical vapor deposition, low pressure chemical vapor deposition, etc. And the passivation layer 7 being formed is not supposed to cover the solder pad 11 on the semiconductor chip 1 (referring to FIG. 11). Next, a first layer polymer film 8 is formed on the passivation layer 7 for reinforcing the passivation layer 7 and acting as a stress buffer. Exemplarily, the first layer polymer film 8 can be a photosensitive polyimide. The redistribution layer 3 is then formed on the first layer polymer film 8, generally the redistribution layer 3 is an electroplated copper with a bottom-coated titanium and copper sputtering layer. As shown in FIG. 11, the connection of the solder pad 11 is externally placed through the redistribution layer 3 and re-directed to other position, so as to provide a suitable space for subsequent implantation of a solder ball 4. Next, a second layer polymer film 9 is formed on the redistribution layer 3, and the second layer polymer film 9 is used to protect the redistribution layer 3. As shown in FIG. 11, the second layer polymer film 9 is provided with an opening, and the opening is used for setting a solder ball metal layer 10. Finally, the solder ball 4 is implanted on the solder ball metal layer 10, thereby completing the connection between the solder ball 4 and the solder pad 11.

Optionally, when the present embodiment is used to form a package structure of Wafer Level Package, the method further includes step 204: cutting the encapsulation layer to obtain a plurality of integrated circuit package structures.

Figure 12:
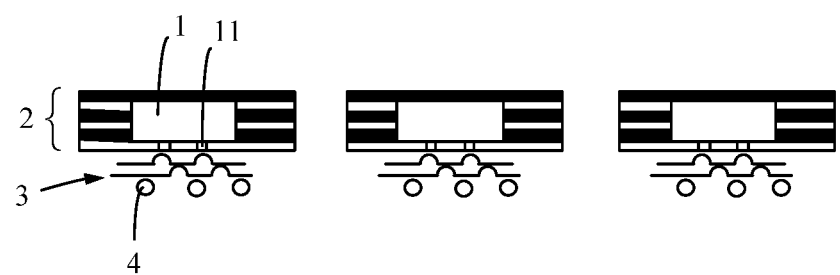
FIG. 12 is an eighth state diagram of an integrated circuit package structure provided by an embodiment of the present disclosure.

As shown in FIG. 12, step 204 includes: cutting the encapsulation layer to divide the plurality of semiconductor chips 1 covered by the encapsulation layer into individual semiconductor chips 1 for subsequent processing.

A package method of an integrated circuit package structure provided by the embodiments of the present disclosure, attaches the semiconductor chip on the package carrier, and the package carrier provides a planar support for the semiconductor chip when packaging the semiconductor chip. And the first encapsulation layer and the second encapsulation layer alternately stacked are formed on the package carrier to obtain the encapsulation layer, and the thermal expansion coefficient of the first encapsulation layer is contrary to the thermal expansion coefficient of the second encapsulation layer, so that the deformations of the first encapsulation layer and the second encapsulation layer can counteract each other, thereby preventing the encapsulation layer from being thermally deformed and facilitating a packaging of the integrated circuits. At the same time, the package carrier having a thermal expansion coefficient of zero can be adopted to reduce the expansion of the package carrier during the process of forming the encapsulation layer, thereby avoiding warpage of the integrated circuit package structure and shift of the semiconductor chip, and facilitating the packaging of integrated circuits.

What have been described above are only specific implementations of the present disclosure, the protection scope of the present disclosure is not limited thereto. Therefore, the protection scope of the present disclosure should be based on the protection scope of the claims.

What is claimed is:

1. An integrated circuit package structure comprising:
   a semiconductor chip; and
   an encapsulation layer covering the semiconductor chip, the encapsulation layer comprising a first encapsulation layer and a second encapsulation layer alternately stacked, a sum of a number of the first encapsulation layer and a number of the second encapsulation layer being at least 3,
   wherein a thermal expansion coefficient of one of the first encapsulation layer and the second encapsulation layer is positive, and a thermal expansion coefficient of the other of the first encapsulation layer and the second encapsulation layer is negative.

2. The integrated circuit package structure according to claim 1, wherein an absolute value of the thermal expansion coefficient of the first encapsulation layer is equal to an absolute value of the thermal expansion coefficient of the second encapsulation layer.

3. The integrated circuit package structure according to claim 2, wherein the absolute value of the thermal expansion coefficient of the first encapsulation layer is 8-13 ppm/° C., and the absolute value of the thermal expansion coefficient of the second encapsulation layer is 8-13 ppm/° C.

4. The integrated circuit package structure according to claim 1, wherein one of the first encapsulation layer and the second encapsulation layer has a composite material of an epoxy resin and a first inorganic compound, the other of the first encapsulation layer and the second encapsulating layer has a composite material of an epoxy resin and a second inorganic compound, the first inorganic compound and the second inorganic compound have a negative thermal expansion coefficient, and an absolute value of the thermal expansion coefficient of the first inorganic compound is less than an absolute value of the thermal expansion coefficient of the second inorganic compound.

5. The integrated circuit package structure according to claim 1, further comprising: a redistribution layer and a solder ball, wherein the redistribution layer comprises a first side and a second side opposite to the first side, the semiconductor chip and the encapsulation layer are located at the first side, the solder ball is located at the second side.

6. The integrated circuit package structure according to claim 5, wherein a side of the semiconductor chip facing the redistribution layer comprises a solder pad, the encapsulation layer coats a surface of the semiconductor chip other than a surface of the solder pad.

7. The integrated circuit package structure according to claim 2, wherein a thickness of the first encapsulation layer is equal to a thickness of the second encapsulation layer.

8. The integrated circuit package structure according to claim 1, wherein an absolute value of the thermal expansion coefficient of the first encapsulation layer is greater than an absolute value of the thermal expansion coefficient of the second encapsulation layer, and a thickness of the first encapsulation layer is less than a thickness of the second encapsulation layer; or, an absolute value of the thermal expansion coefficient of the first encapsulation layer is less than an absolute value of the thermal expansion coefficient of the second encapsulation layer, and a thickness of the first encapsulation layer is greater than a thickness of the second encapsulation layer.

9. A package method of an integrated circuit, comprising:
attaching a semiconductor chip on a package carrier;
forming a first encapsulation layer and a second encapsulation layer alternately stacked on the package carrier to obtain an encapsulation layer, the encapsulation layer covering the semiconductor chip, a sum of a number of the first encapsulation layer and a number of the second encapsulation layer being at least 3, one of the first encapsulation layer and the second encapsulation layer having a positive thermal expansion coefficient, and the other of the first encapsulation layer and the second encapsulation layer having a negative thermal expansion coefficient.

10. The package method according to claim 9, wherein a thermal expansion coefficient of the package carrier is 0-11 ppm/° C.

11. The package method according to claim 9, wherein forming the first encapsulation layer and the second encapsulation layer alternately stacked on the package carrier, comprises:
forming at least one first encapsulation material layer and at least one second encapsulation material layer alternately stacked on the package carrier sequentially;
heating and curing the first encapsulation material layer and the second encapsulation material layer, to obtain the first encapsulation layer and the second encapsulation layer alternately stacked.

12. The package method according to claim 9, further comprising:
after forming the first encapsulation layer and the second encapsulation layer alternately stacked on the package carrier, removing the package carrier;
forming a redistribution layer on an exposed side of the semiconductor chip, and forming a solder ball on a side of the redistribution layer facing away from the semiconductor chip.

13. The package method according to claim 12, further comprising:
after forming the solder ball on the side of the redistribution layer facing away from the semiconductor chip, cutting the encapsulation layer to obtain a plurality of integrated circuit package structures.

14. The package method according to claim 9, wherein an absolute value of the thermal expansion coefficient of the first encapsulation layer is equal to an absolute value of the thermal expansion coefficient of the second encapsulation layer.

15. The package method according to claim 14, wherein the absolute value of the thermal expansion coefficient of the first encapsulation layer is 8-13 ppm/° C., and the absolute value of the thermal expansion coefficient of the second encapsulation layer is 8-13 ppm/° C.

16. The package method according to claim 9, wherein one of the first encapsulation layer and the second encapsulation layer has a composite material of an epoxy resin and a first inorganic compound, the other of the first encapsulation layer and the second encapsulating layer has a composite material of an epoxy resin and a second inorganic compound, the first inorganic compound and the second inorganic compound have a negative thermal expansion coefficient, and an absolute value of the thermal expansion coefficient of the first inorganic compound is less than an absolute value of the thermal expansion coefficient of the second inorganic compound.

17. The package method according to claim 12, wherein a side of the semiconductor chip facing the redistribution layer comprises a solder pad, the encapsulation layer coats a surface of the semiconductor chip other than a surface of the solder pad.

18. The package method according to claim 14, wherein a thickness of the first encapsulation layer is equal to a thickness of the second encapsulation layer.

19. The package method according to claim 9, wherein an absolute value of the thermal expansion coefficient of the first encapsulation layer is greater than an absolute value of the thermal expansion coefficient of the second encapsulation layer, and a thickness of the first encapsulation layer is less than a thickness of the second encapsulation layer; or, an absolute value of the thermal expansion coefficient of the first encapsulation layer is less than an absolute value of the thermal expansion coefficient of the second encapsulation layer, and a thickness of the first encapsulation layer is greater than a thickness of the second encapsulation layer.

* * * * *